US009641065B2

(12) United States Patent
Seok

(10) Patent No.: US 9,641,065 B2
(45) Date of Patent: May 2, 2017

(54) AC LINE FILTER AND AC-TO-DC RECTIFIER MODULE

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 216 days.

(21) Appl. No.: 14/732,688

(22) Filed: Jun. 6, 2015

(65) Prior Publication Data

US 2016/0359404 A1 Dec. 8, 2016

(51) Int. Cl.
*H02M 1/44* (2007.01)
*H02M 1/12* (2006.01)
*H02M 7/217* (2006.01)
*H02M 7/219* (2006.01)

(52) U.S. Cl.
CPC ............. *H02M 1/44* (2013.01); *H02M 1/126* (2013.01); *H02M 7/219* (2013.01); *H02M 2007/2195* (2013.01)

(58) Field of Classification Search
CPC .......... H02M 1/12; H02M 1/126; H02M 1/44; H02M 2001/123; H02M 7/217; H02M 7/219
USPC .......................................................... 363/44
See application file for complete search history.

(56) References Cited

U.S. PATENT DOCUMENTS

| | | | |
|---|---|---|---|
| 4,408,171 A | 10/1983 | Akino et al. | 333/177 |
| 5,195,232 A | 3/1993 | Frederick | 29/502.1 |
| 5,340,944 A | 8/1994 | Wang | 174/52.1 |
| 5,475,347 A | 12/1995 | Kwak | 333/185 |
| 6,839,250 B2 * | 1/2005 | Takahashi | H02M 1/44 363/40 |
| 7,744,419 B2 | 6/2010 | Blum et al. | 439/620.1 |
| 8,624,689 B2 | 1/2014 | Hsieh et al. | 333/185 |
| 8,648,399 B2 | 2/2014 | Seok | 257/277 |
| 8,649,199 B2 | 2/2014 | Seok | 363/147 |
| 8,737,094 B2 | 5/2014 | Seok et al. | 363/21.14 |

(Continued)

OTHER PUBLICATIONS

"Application Note: EMC/EMI Filter Design with RB Common-Mode Chokes", by Schaffner Group, 22 pages (copyright Jul. 2013).
U.S. Appl. No. 14/675,704, filed Mar. 15, 2015, Seok.

*Primary Examiner* — Jue Zhang
*Assistant Examiner* — Jye-June Lee
(74) *Attorney, Agent, or Firm* — Imperium Patent Works; T. Lester Wallace

(57) ABSTRACT

An AC line filter module includes AC-to-DC rectification circuitry. The rectification circuitry includes four low forward voltage rectifiers coupled together as two high-side rectifiers and two low-side rectifiers, where each low forward voltage rectifier includes an NPN bipolar transistor and a parallel-connected diode. A current splitting pair of inductors splits a return current so that a portion of the current is supplied to the collector of an NPN bipolar transistor that is on, and so that the remainder of the current is supplied to the base of the transistor that is on. Both low-side rectifiers are driven by these current splitting inductors. A pair of base current return diodes provides base current return paths. Due to the use of NPN bipolar transistors and no PNP bipolar transistors, manufacturing cost is reduced and efficiency is improved as compared to an implementation that uses low forward voltage rectifiers having PNP transistors.

22 Claims, 8 Drawing Sheets

(56) References Cited

U.S. PATENT DOCUMENTS

| | | | |
|---|---|---|---|
| 2004/0189265 A1* | 9/2004 | Rice | H02M 5/297 |
| | | | 323/234 |
| 2013/0285210 A1* | 10/2013 | Seok | H02M 7/04 |
| | | | 257/566 |
| 2016/0226394 A1* | 8/2016 | Seok | H02M 1/126 |

* cited by examiner

FRONT VIEW
OF THE AC LINE FILTER AND
RECTIFIER MODULE (ACLF/RM)

SIDE VIEW OF
THE ACLF/RM

BOTTOM VIEW
OF THE ACLF/RM

PERSPECTIVE VIEW OF THE TOP
OF THE ACLF/RM

PERSPECTIVE VIEW OF THE
BOTTOM OF THE ACLF/RM

MAJOR CURRENT FLOW AT TIME T1

MINOR (BASE) CURRENT FLOW AT TIME T1

MAJOR CURRENT FLOW AT TIME T2

MINOR (BASE) CURRENT FLOW AT TIME T2

AC LINE FILTER AND AC-TO-DC RECTIFIER MODULE

TECHNICAL FIELD

The described embodiments relate to AC line filters and to AC-to-DC rectifiers, and to related structures and methods.

BACKGROUND INFORMATION

Many electronic appliances and devices include an AC line filter as well as a full-wave bridge rectifier. Although the AC line filter component goes by a few different names in the art such as, for example, an "EMI filter", the term "AC Line Filter" will be used here. The electronic appliance or device receives AC power through its AC line filter. The AC line filter in some cases is a module assembly that includes a standard IEC 60320-1 C 14 three-terminal power inlet socket through which 110 volt (RMS) AC wall power is received onto the AC line filter. The socket has three input terminals, one of which is a ground terminal GND. The other two input terminals may be referred to as the LINE terminal and the NEUTRAL terminal. A power cord, having a standard plug that engages the 110 volt AC socket, is coupled to the electronic device to provide AC wall power from a wall socket, through the cord, and to the AC line filter. In addition to the three input terminals of the power input socket, the AC line filter module also has three output terminals. One of these output terminals is a ground terminal GND. The 110 volt (RMS) AC as output by the AC line filter across these other two output terminals is then received by another device, an external four terminal full-wave bridge rectifier device. The AC output of the AC line filter is rectified by the full-wave bridge rectifier device into a rough DC voltage. This rough DC voltage is often times then smoothed or stored in a capacitor that is connected across the two output terminals of the full-wave bridge rectifier device. If, for example, the input AC power to the electronic appliance is 110 volts (RMS), then the rough DC voltage as output by the full-wave bridge rectifier device has an approximate DC voltage of 156 volts DC.

SUMMARY

An AC line filter module performs both a line filtering function as well as an AC-to-DC rectification function. The module is referred to as an AC Line Filter/Rectifier Module or "ACLF/RM". AC-to-DC rectification circuitry within the module housing includes four low forward voltage rectifiers. The four low forward voltage rectifiers are coupled together as two high-side low forward voltage rectifiers and two low-side low forward voltage rectifiers, where each low forward voltage rectifier includes an NPN bipolar transistor and a parallel-connected diode. A current splitting pair of inductors splits a return current so that a portion of the current is supplied to the collector of an NPN bipolar transistor that is on, and so that the remainder of the current is supplied to the base of the NPN bipolar transistor. The two low-side low forward voltage rectifiers are driven in this way by this current splitting pair of inductors. A pair of additional diodes provides base current return paths. Due to the use of NPN bipolar transistors and no PNP bipolar transistors, the manufacturing cost of the module is reduced and efficiency is improved and heat dissipation is reduced as compared to an ACLF/RM implementation using low forward voltage rectifiers involving PNP transistors. Rather than being implemented in module form, the circuitry of the AC line filter and rectifier is implemented in other embodiments in discrete form outside of any module housing. For example, the electronic components of the AC line filter and rectifier circuit are mounted on the printed circuit board of a larger electronic device along with other components of that device.

In a method of manufacture, four low forward rectifier circuits are provided on a printed circuit board within an ACLF/RM housing, where each of the low forward rectifier circuits comprises an NPN bipolar transistor and a parallel-connected diode, but no other power transistor and no PNP bipolar transistor. A pair of DC output module terminals and a pair of AC input module terminals are provided as parts of the ACLF/RM such that: 1) during a part of a first half cycle of a cycle of an AC input voltage signal a current can flow through a first pair of the four low forward voltage rectifier circuits so that a rectified version of the AC input voltage signal is output onto and is present across the pair of DC output module terminals, and 2) during a part of a second half cycle of the cycle of the AC input voltage signal a current can flow through a second pair of the four low forward voltage rectifier circuits so that the rectified version of the AC input voltage signal is output onto and is present across the pair of DC output module terminals. In an example of the method of manufacture, an additional current splitting inductor circuit is provided on the printed circuit board within the ACLF/RM housing. This current splitting inductor circuit is coupled to receive a return current via a first node (for example, the GND DC output module terminal), and to output a first part of the current onto a second node, and to output a second part of the current onto a third node. In one example, the current splitting inductor circuit is provided such that the second node is coupled to the bases of the two NPN bipolar transistors of the low-side low forward voltage rectifiers, and such that the third node is coupled to the collectors of the two NPN bipolar transistors of the low-side low forward voltage rectifiers. The current splitting inductor circuit is provided so that it will drive current into the base of the NPN bipolar transistor of which ever one of the low-side low forward voltage rectifiers is on. In an example of the method of manufacture, a pair of base current return diodes is provided on the printed circuit board within the ACLF/RM. These components are provided in the method of manufacture so that the housing contains no power transistors, other than NPN bipolar transistors.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
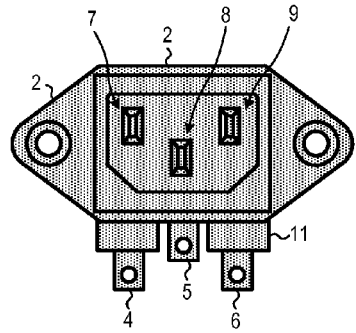
FIG. 1 is a front view of an AC Line Filter/Rectifier Module (ACLF/RM) in accordance with one novel aspect.

Reference will now be made in detail to background examples and some embodiments of the invention, examples of which are illustrated in the accompanying drawings.

The entirely of U.S. patent application Ser. No. 13/931,599, entitled "Full Bridge Rectifier Module", filed Jun. 28, 2013, by Kyoung Wook Seok, and published as U.S. Patent publication US20130285210, is incorporated herein by reference. As explained in the Ser. No. 13/931,599 patent application, there is conduction loss in the four diodes of a conventional full-wave bridge rectifier. The wasted energy is manifest as generated heat. Cost is often involved in providing heat sinking in order to remove this heat. In one example, such a full-wave bridge rectifier is the input full-wave bridge rectifier of an electronic appliance. The full-wave bridge rectifier receives 110 volts (RMS) AC power from a power source (for example, from 110 volts (RMS) AC wall power) and outputs a rectified DC voltage that is then smoothed or stored in an output storage capacitor. The rough DC voltage on the capacitor is about 156 volts. This circuit serves as the power-receiving front end of the electronic appliance.

There are four diodes in such a conventional full-wave bridge rectifier. U.S. patent application Ser. No. 13/931,599 patent application discloses a circuit referred to here as a "low forward voltage rectifier" that can be used in place of a diode in such a full-wave bridge rectifier. The "low forward voltage rectifier" includes a bipolar transistor and a parallel-connected diode. The term "low forward voltage rectifier" as it is used here in this patent document refers to one such bipolar transistor and its associated parallel-connected diode, and also may or may not include associated inductive current splitting circuitry that controls the base current of the bipolar transistor such that the transistor and its parallel-connected diode operate together as a low forward voltage rectifier. Where there ordinarily would be a larger forward voltage drop across a standard diode (for example, about 1.0 volts) when current is flowing through the diode in a conventional full-wave bridge rectifier, a lower forward voltage drop (for example, 0.3 volts to 0.4 volts) is seen across each rectifier of a full-wave bridge rectifier that employs low forward voltage rectifiers rather than conventional diodes. This lower forward voltage drop translates into higher energy efficiency, less heat generation in the full-wave bridge rectifier, and less cost involved in providing any necessary heat sinking.

FIG. 13 of the Ser. No. 13/931,599 patent application discloses a first embodiment of a new full-wave bridge rectifier component or part. The new full-wave bridge rectifier part involves four of the new low forward voltage rectifiers. This embodiment includes two "two-winding inductors". Such a two-winding inductor can also be called a two-winding transformer, but the core preferably has an air gap. In the case of the core of the transformer being a toroid, the material of which the toroid is made provides a distributed air gap.

FIG. 28 of the Ser. No. 13/931,599 patent application also discloses a second embodiment of the new full-wave bridge rectifier part. This second embodiment also involves four of the new low forward voltage rectifiers and two two-winding inductors. These two different embodiments are in substantial measure functionally interchangeable.

In one implementation, a packaged electronic component or part is made where the part includes the entire full-wave bridge rectifier circuit. The various bipolar transistors, diodes and two-winding inductors are mounted onto a custom lead frame, and are then overmolded with plastic as set forth in the Ser. No. 13/931,599 patent application. In this way, the four low forward voltage rectifiers and the two two-winding inductors are all encapsulated together in a single injection molded plastic part. This part is a drop-in replacement for a standard full-wave bridge rectifier part available on the market, except that if the new improved full-wave bridge rectifier part is used then the user will see less energy waste and undesirable less heat generation.

Unfortunately, providing the two-winding inductors (the two transformers) involves an extra expense that is not present when using a conventional full-wave bridge rectifier. There are no such two-winding inductors in a conventional full-wave bridge rectifier. Moreover, the two-winding inductors are physically large and it may be difficult to include them in the same encapsulated device along with the bipolar transistors and diodes. The two-winding inductors cannot be made smaller because the main current flowing through the full-wave bridge rectifier has to flow through inductor windings, so the wire of the inductor has to be of a large diameter. Also, there is a substantial tooling cost involved both in making a custom leadframe (as set forth in FIG. 22 and FIG. 29 of the Ser. No. 13/931,599 patent application) and in making custom injection molded plastic molds required to make the new large custom part that is adequately large to accommodate the two-winding inductors. These are substantial costs.

U.S. patent application Ser. No. 14/611,193, entitled "AC Line Filter And AC-to-DC Rectifier", filed Jan. 31, 2015, by Kyoung Wook Seok, discloses an AC Line Filter/Rectifier Module (ACLF/RM) that includes both an AC line filter and a full-wave bridge rectifier, where the full-wave bridge rectifier includes four of the "low forward voltage rectifiers." Two of the low forward voltage rectifiers involve NPN bipolar transistors, and the other two of the low forward voltage rectifiers involve NPN bipolar transistors. Inductive components that would otherwise have to be included in the AC line filter are used not just for their line filtering functions, but rather are also used in the ACLF/RM to perform a current directing function so that they can drive the bipolar transistors of the low forward voltage rectifiers of the full-wave bridge rectifier.

There are two PNP RBJT devices in an ACLF/RM circuit set forth in U.S. patent application Ser. No. 14/611,193. It is now recognized that to make a good PNP bipolar transistor for that circuit that has a comparable $V_{CE(SAT)}$ to the he $V_{CE(SAT)}$ of the complementary NPN bipolar transistor, and to make the PNP bipolar transistor so that it will have an adequately high reverse voltage breakdown rating for use in the ACLF/RM, the die size of the PNP bipolar transistor would be about three times larger than the die size of the complementary NPN bipolar transistor. The PNP transistors would therefore be relatively costly. In addition, the ratio (about 0.25) of base current to collector current under saturation conditions is substantially higher for the PNP bipolar transistor as compared to the ratio of base current to collector current (about 0.09) under saturation conditions for the complementary NPN bipolar transistor. The higher base current for a given desired amount of collector current means that the PNP RBJTs will cause more power loss as compared to the NPN RBJTs. When a bipolar transistor is in saturation, its $V_{CE(SAT)}$ may be low (as low as 0.2 volts) but the voltage drop between the base and emitter may be 0.7 volts or more, so the higher base current in the PNP transistors flowing across the base-to-emitter junctions (that has a higher voltage drop) results in substantial power loss. It is desired not to be required to provide additional heat sinking in the ACLF/RM just to get rid of heat generated by this power loss. Accordingly, for various reasons, the PNP RBJTs in the ACLF/RM circuit are less efficient that NPN RBJTs, are more costly than the NPN RBJTs, and may introduce heat sinking problems not attendant with NPN RBJTs.

In one novel aspect, an AC Line Filter/Rectifier Module (ACLF/RM) 1 is disclosed that requires and includes no PNP bipolar transistors or PNP RBJTs, but rather each of its four "low forward voltage rectifiers" includes one NPN bipolar transistor and a parallel-connected diode and no PNP bipolar transistor. Each NPN bipolar transistor and its companion parallel-connected diode can be provided either: 1) as a single NPN RBJT device involving an NPN bipolar transistor and a distributed diode both realized on the same semiconductor device die, or 2) as a discrete NPN bipolar transistor device and a separate discrete diode device. The housing of the ACLF/RM is an enclosure that encloses no power transistor (no power MOSFET and no power IGBT and no power PNP bipolar transistor) other than the four NPN bipolar transistors of the four low forward voltage rectifier circuits.

Figure 2:
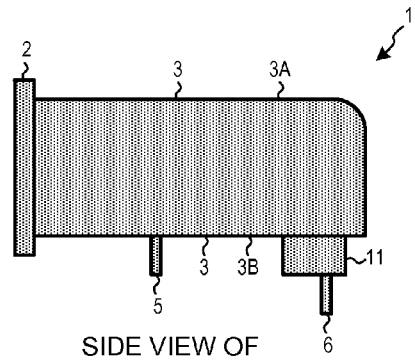
FIG. 2 is a side view of the ACLF/RM of FIG. 1.
Figure 3:
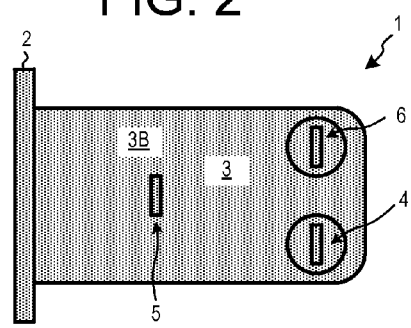
FIG. 3 is a bottom view of the ACLF/RM of FIG. 1.

FIG. 1 is a front view of one embodiment of the AC Line Filter/Rectifier Module (ACLF/RM) 1. FIG. 2 is a side view of the ACLF/RM 1. FIG. 3 is a bottom view of the ACLF/RM 1. Advantageously, the ACLF/RM 1 has the appearance of a common commercially available AC line filter module. The ACLF/RM 1 includes an IEC 60320 C14 AC inlet power socket portion 2, a housing or enclosure 3, and three DC output module terminals 4, 5 and 6. The AC inlet power socket portion 2 includes three AC input module terminals 7, 8 and 9. AC input module terminal 8 is coupled to DC output module terminal 5. These terminals 8 and 5 are ground terminals. There are multiple ways of realizing the housing or enclosure 3. In one example, two metal pieces are welded or otherwise joined together to make a strong metal housing. These two pieces are a stamped scoop-shaped case portion 3A a flat planar cover portion 3B.

Figure 4:
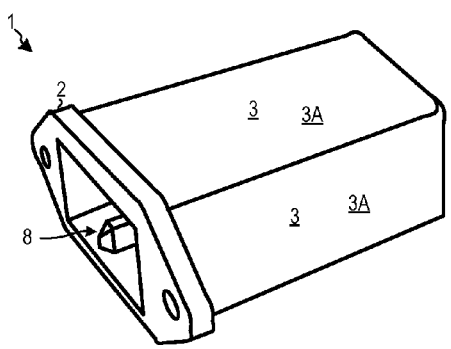
FIG. 4 is a perspective view of the ACLF/RM of FIG. 1.
Figure 5:
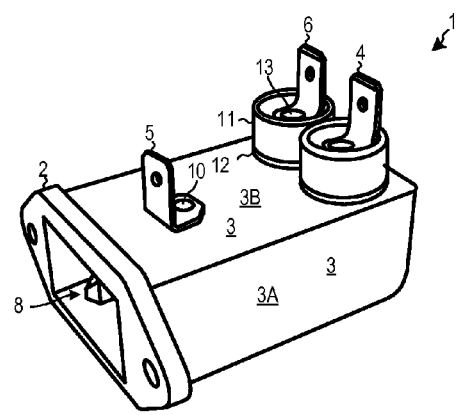
FIG. 5 is a perspective view from the vantage of a front/bottom corner of the ACLF/RM of FIG. 1.

FIG. 4 is a perspective view from the vantage of a front/top corner of the ACLF/RM 1. FIG. 5 is a perspective view from the vantage of a front/bottom corner of the ACLF/RM 1. Terminal 5 is a tab terminal that is connected by a rivet 10 to the metal housing 3. Terminal 5 is also electrically connected to terminal 8 via a metal wire or strip within the housing. Terminal 6 is a tab terminal that is insulated from the metal housing 3 by an insulative plastic standoff 11 and insulative washer 12 and a second insulative washer (not shown) located on the inside of the metal housing. Electrical connection is made from the metal tab terminal 6 on the outside of the metal housing, via a rivet 13 through the center of the insulative standoff and the centers of the washers to a rivet head located on the inside of the metal housing. The rivet 13 both holds the insulative standoff and washers together and also provides electrical continuity from the terminal tab 6 on the outside of the metal housing to the rivet head on the inside of the metal housing. Terminal 4 is fixed to the metal housing in similar fashion. Each of the three terminals 7, 8 and 9 is actually a stamped metal member that extends through the plastic block portion of the inlet socket and then turns downward and engages a printed circuit board. The printed circuit board (not shown) is disposed within the metal housing. The electrical components of the ACLF/RM are disposed on and are soldered to the printed circuit board. The AC input module terminals 7-9 and the DC output module terminals 4-6 are accessible from outside the metal housing 3, but all the other electrical components of the ACLF/RM are disposed within the housing on the printed circuit board.

Figure 6:
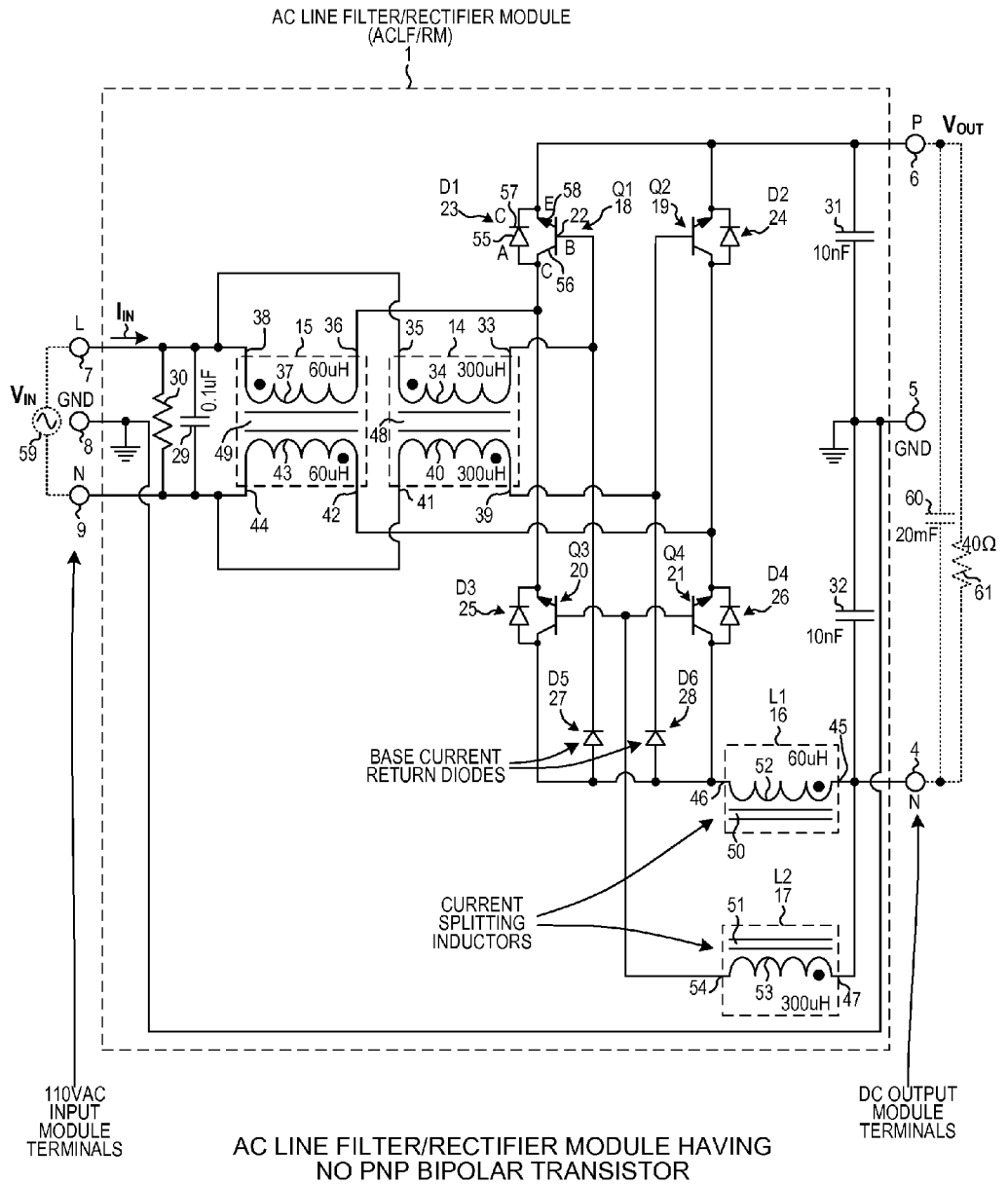
FIG. 6 is a circuit diagram of the ACLF/RM 1 of FIGS. 1-5.

FIG. 6 is a circuit diagram of the ACLF/RM 1. ACLF/RM 1 includes a first two-winding inductor 14, a second two-winding inductor 15, a first one-winding inductor L1 16, a second one-winding inductor L2 17, four NPN bipolar transistors 18-21, four parallel diodes 23-26, two base current return diodes D5 27 and D6 28, an input filter capacitor 29, an optional input bleed resistor 30, and two output filter capacitors 31 and 32. NPN bipolar transistors 18-21 have reverse breakdown withstand voltages (between each pair of their three terminals) that are adequately high to withstand voltages across them when the ACLF/RM 1 is in use. In the case of the ACLF/RM 1 being a module designed to receive 110 volts (RMS) AC, the reverse breakdown withstand voltage of the bipolar transistors in one example is at least 200 volts. This reverse breakdown withstand voltage requirement is determined as follows. If the input AC power is 110 volts AC (RMS), then the rectified voltage out of the full-wave bridge rectifier is about 156 volts DC. At an average current of 3.6 amperes and at an average DC output voltage of 140 volts, the ACLF/RM 1 supplies about 500 watts to the appliance. In order to be able to withstand a 156 volt reverse voltage condition in the bipolar transistors so that the bipolar transistors will not fail when the ACLF/RM is used in receiving 110 volts AC, an amount of margin is required beyond the 156 peak volts, so bipolar transistors that do not suffer reverse breakdown for voltages less than 200 volts are used. This means that if a positive voltage is placed on the emitter with respect to the base ($V_{EB}$), and this voltage is increased, then the base-to-emitter PN junction cannot breakdown under the reverse bias condition until the voltage $V_{EB}$ exceeds 200 volts. This is the same thing as saying that the base-to-emitter junction cannot break down for negative $V_{BE}$ voltages unless the $V_{BE}$ voltage is more negative than −200 volts. In addition, if a positive voltage is placed on the emitter with respect to the collector ($V_{EC}$), and this voltage is increased, then the base-to-emitter PN junction cannot break down under the reverse bias condition until the $V_{EC}$ voltage exceeds 200 volts. This is the same thing as saying that the base-to-emitter junction cannot break down for negative $V_{CE}$ voltages unless the $V_{CE}$ voltage is more negative than −200 volts. The peak current through the bipolar transistors is about 15 amperes (for a four millisecond pulse width) for a 500 watt application, and a margin is required, so transistors are used whose maximum collector-to-emitted current is at least 30 amperes. So the NPN bipolar transistors 18-21 are 200V ($V_{EB}$ and $V_{EC}$ reverse breakdown withstand voltage), 30 A bipolar transistors.

In the embodiment of FIG. 6, the NPN bipolar transistors 18-21 are discrete, individually packaged, NPN power bipolar transistors that are packaged separately from the diodes D1-D6. Similarly, each of the diodes D1-D6 is an individually packaged electronic component. In one advantageous aspect as described in further detail below, discrete components are used and this allows inexpensive mass-produced high-volume commercially-available devices to be used in making the ACLF/RM 1. Each of the base current return diodes D5 and D6 is about one tenth the size (and has about one tenth the current rating) of each of the parallel-connected diodes D1-D4.

In one novel aspect, conventional NPN bipolar transistors are used for the NPN transistors Q1-Q4 of the ACLF/RM circuit of FIG. 6. One type of conventional power NPN bipolar transistor is made starting with a wafer of N+ type substrate silicon. An N-type epitaxial layer is formed on the N+ type substrate wafer silicon. A P type base region is then diffused from the upper surface of the epitaxial layer down into the N-type epitaxial layer, and an N+ type emitter region is diffused from the upper surface of the epitaxial layer down into the P type base region. A single layer of metal is deposited onto the top side of the structure and this layer of metal is etched to form two separate electrodes out of the single metal layer: 1) an emitter electrode that makes contact with the N+ type emitter region, and 2) a base electrode that makes contact with the P type base region. The bottom side of the N+ type substrate is also metalized, and this backside metal forms a collector electrode of the NPN transistor device. This type of structure is conventionally used to make power bipolar transistors because it is an inexpensive and economical for a variety of reasons.

Due to the need to counterdope to form the P type base region into the already-doped N-type epitaxial layer, and due to the need to counterdope to form the N+ type emitter region into the already-doped P type base region, the N-type epitaxial layer has the lowest concentration of dopants, then the P type base region has the next highest concentration of dopants, and then the N+ type emitter has a still higher concentration of dopants. This means that either side of the base-to-emitter PN junction is silicon having a relatively high dopant concentration. Due to the highly doped silicon on each side of the junction, under reverse bias conditions of this base-to-emitter junction the depletion region is quite thin. Because the depletion region is thin, the electric field strength across the junction is high. Consequently, the base-to-emitter PN junction has a low reverse breakdown voltage of about ten volts. This is far too low of a reverse breakdown voltage for the ACLF/RM circuit of FIG. 6 where the ACLF/RM circuit is to receive 110 volts AC RMS and is to output 140 volts DC. In such a case, for example, the Q1 transistor may be on, and the 140 volts DC present on the P output module terminal 6 may be present on the emitter of Q1. Because the Q1 transistor would be on and conductive, about 140 volts would also be present on the collector of transistor Q1. Therefore about 140 volts would be present on the emitter of transistor Q3. Transistor Q3 would be off. Accordingly, a 140 volt reverse voltage would be present between the emitter of transistor Q3 and the collector of transistor Q3. Transistor Q3 must be able to withstand this 140 volts without having its base-to-emitter junction break down. The conventional NPN bipolar transistor described above that only has a ten volt $V_{BE}$ reverse breakdown voltage cannot therefore be used in ordinary fashion in the place of bipolar transistor Q3.

In accordance with one novel aspect, such a conventional NPN bipolar transistor is used for bipolar transistor Q3 despite the fact that it has an apparent $V_{BE}$ reverse breakdown withstand voltage that is far smaller than the 200 volts required for the ACLF/RM circuit of FIG. 6, but rather than using its diffused N+ region as the emitter of the transistor in the circuit of FIG. 6, and rather than using its N+ substrate silicon layer as the collector of the transistor in the circuit of FIG. 6, the electrode to the N+ type substrate of the conventional device is used as the emitter of the transistor in FIG. 6, and the electrode to the N+ type diffusion region of the conventional device is used as the collector electrode in FIG. 6. Because the device is connected in this way, the base-to-emitter PN junction across which the reverse voltage is present is the PN junction between the P type diffusion region and the N-type epitaxial layer (rather than between the P type diffusion region and the N+ type diffusion region). The N-type epitaxial silicon has a lower doping concentration (as compared to the doping concentration of the N+ type diffusion region), so under reverse bias conditions the depletion region (at the PN junction between the P type diffusion region and the N-type epitaxial layer) will be relatively wide. The wide depletion region reduces the magnitude of the electric field, and allows this PN junction to have a reverse breakdown voltage of more than 200 volts. This P type diffusion region to N-type epitaxial layer PN junction is the PN junction used as the base-to-emitter junction. Accordingly, mass produced and relatively inexpensive conventional NPN bipolar transistors of the type described above can be used for the NPN bipolar transistors in the ACLF/RM of FIG. 6, but their so-called emitter electrodes (their electrodes that are coupled to their N+ diffusion regions) are used as the collector electrodes and their so-called collector electrodes (their electrodes coupled to their N+ type substrate silicon layers) of those transistors are be used as the emitter electrodes.

Some such conventional single metal layer transistors may, however, also have built-in anti-parallel (free-wheeling) diodes, and the presence of the diodes may not be well published or documented in transistor documentation but nonetheless the diodes are present. Due to reversed use of the emitter and collector terminals of the conventional devices when the devices are used in the ACLF/RM, the anti-parallel diodes of the conventional devices are actually parallel diodes in the ACLF/RM circuit. Consequently it may not be necessary to provide the additional discrete parallel diode components, but rather the provided diodes of the conventional bipolar transistor devices function as the parallel diodes. If these diodes have adequate performance in the ACLF/RM application, then use of such conventional transistors may be advantageous in that component count on the printed circuit board in the module is reduced.

Such a conventional single metal layer NPN bipolar transistor, while it can be used in the ACLF/RM of FIG. 6 as set forth above, has several drawbacks. One drawback is that its emitter metal electrode (which is used in accordance with one novel aspect as the collector electrode) is generally interdigitated with a similarly shaped multi-fingered base metal electrode. Both digitated electrodes are formed from the same single layer of metal. High current flowing through the device generally flows through this multi-fingered emitter metal electrode (now used as the collector electrode). This high current therefore passes through these thin, and therefore fairly resistive, fingers of metal as the current flows between a bond bad of the top-side electrode and the electrode on the backside of the die. The result of the high current flow across this resistance is a lower efficiency as compared to utilizing an optimized RBJT as set forth in U.S. patent application Ser. No. 14/611,193 (the entire contents of which is incorporated herein by reference). An advantage, however, is that a mass produced, inexpensive, commercially available NPN bipolar transistor can be used.

With respect to the first NPN bipolar transistor Q1 18 and its associated parallel-connected diode D1 23, the anode 55 (denoted "A" in the diagram) of diode D1 is coupled to the collector 56 (denoted "C" in the diagram) of transistor Q1. The cathode 57 (denoted "C" in the diagram) of diode D1 is coupled to the emitter 58 (denoted "E" in the diagram) of transistor Q1. Reference numeral 22 identifies the base of transistor Q1. Transistor Q1 and diode D1 are parts of a first high-side low forward voltage rectifier circuit. Transistor Q2 and diode D2 are parts of a second high-side low forward voltage rectifier circuit. These low forward voltage rectifier circuits are referred to as "high-side" because they are coupled to the $V_{OUT}$ DC output module terminal 6. Transistor Q3 and diode D3 are parts of a first low-side low forward voltage rectifier circuit. Transistor Q4 and diode D4 are parts of a second low-side low forward voltage rectifier circuit. These low forward voltage rectifier circuits are referred to as "low-side" because they are coupled (through current splitting inductors L1 and L2) to the ground DC output module terminal 4.

A first terminal end 33 of the first winding 34 of the first two-winding inductor 14 is coupled to the base of bipolar transistor Q1 18 and to the cathode of diode D5 27. A second terminal end 35 of the first winding 34 of the first two-winding inductor 14 is coupled to the LINE AC input module terminal 7. The first two-winding inductor 14 has a coupling coefficient K of about 1.0.

A first terminal end 36 of the first winding 37 of the second two-winding inductor 15 is coupled to the collector of the bipolar transistor Q1 18 and to the emitter of bipolar transistor Q3 20. A second terminal end 38 of the first winding 37 of the second two-winding inductor 15 is coupled to the LINE AC input module terminal 7. The second two-winding inductor 15 also has a coupling coefficient K of about 1.0.

A first terminal end 39 of the second winding 40 of the first two-winding inductor 14 is coupled to the base of bipolar transistor Q2 19 and to the cathode of diode D6 28. A second terminal end 41 of the second winding 40 of the first two-winding inductor 14 is coupled to the NEUTRAL AC input module terminal 9.

A first terminal end 42 of the second winding 43 of the second two-winding inductor 15 is coupled to the collector of the bipolar transistor Q2 19 and to the emitter of bipolar transistor Q4 21. A second terminal end 44 of the second winding 43 of the second two-winding inductor 15 is coupled to the NEUTRAL AC input module terminal 9.

The two windings 34 and 40 of the first two-winding inductor 14 are wound around a common core 48. The two windings 37 and 43 of the second two-winding inductor 15 are wound around a common core 49.

The bleed resistor 30 and the input capacitor 29 are coupled together in parallel between the LINE AC input module terminal 7 and the NEUTRAL AC input module terminal 9.

A first terminal end 45 of the winding 52 of the first one-winding inductor L1 16 is coupled to the N DC output module terminal 4. A second terminal end 46 of the winding 52 of the first one-winding inductor L1 16 is coupled to the collectors of bipolar transistors Q3 and Q4 and to the anodes of diodes D5 and D6. A first terminal end 47 of the winding 53 of the second one-winding inductor L2 17 is coupled to the N DC output module terminal 4. A second terminal end 54 of the winding 53 of the second one-winding inductor L2 17 is coupled to the bases of bipolar transistors Q3 and Q4. The winding 52 of the first one-winding inductor L1 16 is wound around a core 50, and the winding 53 of the second one-winding inductor L2 17 is wound around another core 51. The two one-winding inductors L1 and L2 perform a current splitting function, in that a certain proportion of the total current flowing from the N DC output module terminal 4 and into the ACLF/RM is made to flow into the one-winding inductor L2, and this current is then driven into the base of which ever one of the first and second low-side low forward voltage rectifiers (Q3/D3 or Q4/D4) it is that is on and conductive. The collector current is being supplied by the one-winding inductor L1. The voltage drop across inductor L1 is close to the same as the voltage drop across inductor L2 because the second terminal end 46 of inductor is coupled to the collector of the conductive bipolar transistor and the second terminal end 54 of inductor L2 is coupled to the base of the conductive bipolar transistor. The voltage between the collector and the base of the transistor is small, so the voltage drops across the inductors L1 and L2 are roughly the same, so the two inductors operate as a current splitting inductor circuit where the ratio of the inductance of one-winding inductor L1 to the inductance of one-winding inductor L2 determines the ratio of collector current to base current in whichever one of the first and second low-side low forward voltage rectifiers (Q3/D3 or Q4/D4) it is that is on and conductive.

Capacitor 31 is coupled between the P DC output module terminal 6 and the GND DC output module terminal 5. The capacitor 32 is coupled between the GND DC output module terminal 5 and the N DC output module terminal 4. Each of the capacitors 31 and 32 is, in some examples, a three-terminal capacitor referred to in the art as a feed-through capacitor. For example, capacitor 31 may be a feed-through capacitor. The feed-through capacitor has two feed-through leads that are coupled to a first plate of the capacitor. The feed-through capacitor also has a third lead that is coupled to a second plate of the capacitor. The first feed-through lead is coupled to receive current from the node at the emitter sides of bipolar transistors Q1 and Q2 and the second feed-through lead is coupled to supply current to the P DC output module terminal 6. The third lead of the capacitor is coupled to the GND DC output module terminal 5. In similar fashion, capacitor 32 may be implemented as a second three-terminal feed-through capacitor.

Figure 7:
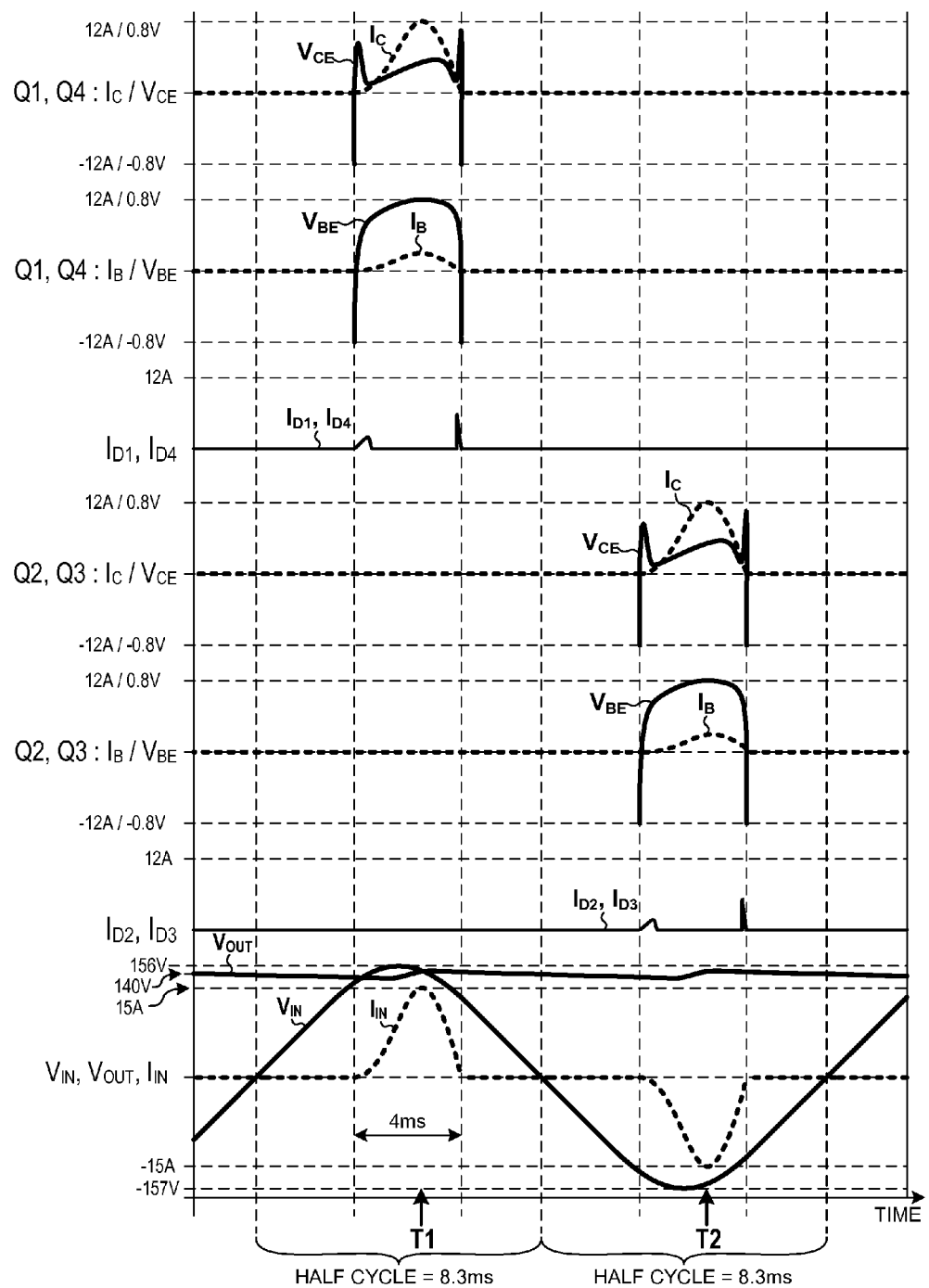
FIG. 7 is a waveform diagram that illustrates operation of the ACLF/RM 1 of FIGS. 1-6 when the ACLF/RM is being driven by a 110 volts AC RMS sinusoidal 60 hertz supply voltage.

FIG. 7 is a waveform diagram that shows an operation of the ACLF/RM 1 when the ACLF/RM is driven by voltage source 59 that outputs a 110 volts AC RMS sinusoidal 60 hertz supply voltage. The ACLF/RM is loaded with an external 20 millifarad output capacitor 60 and an external 40 ohm load resistor 61.

Figure 8A:
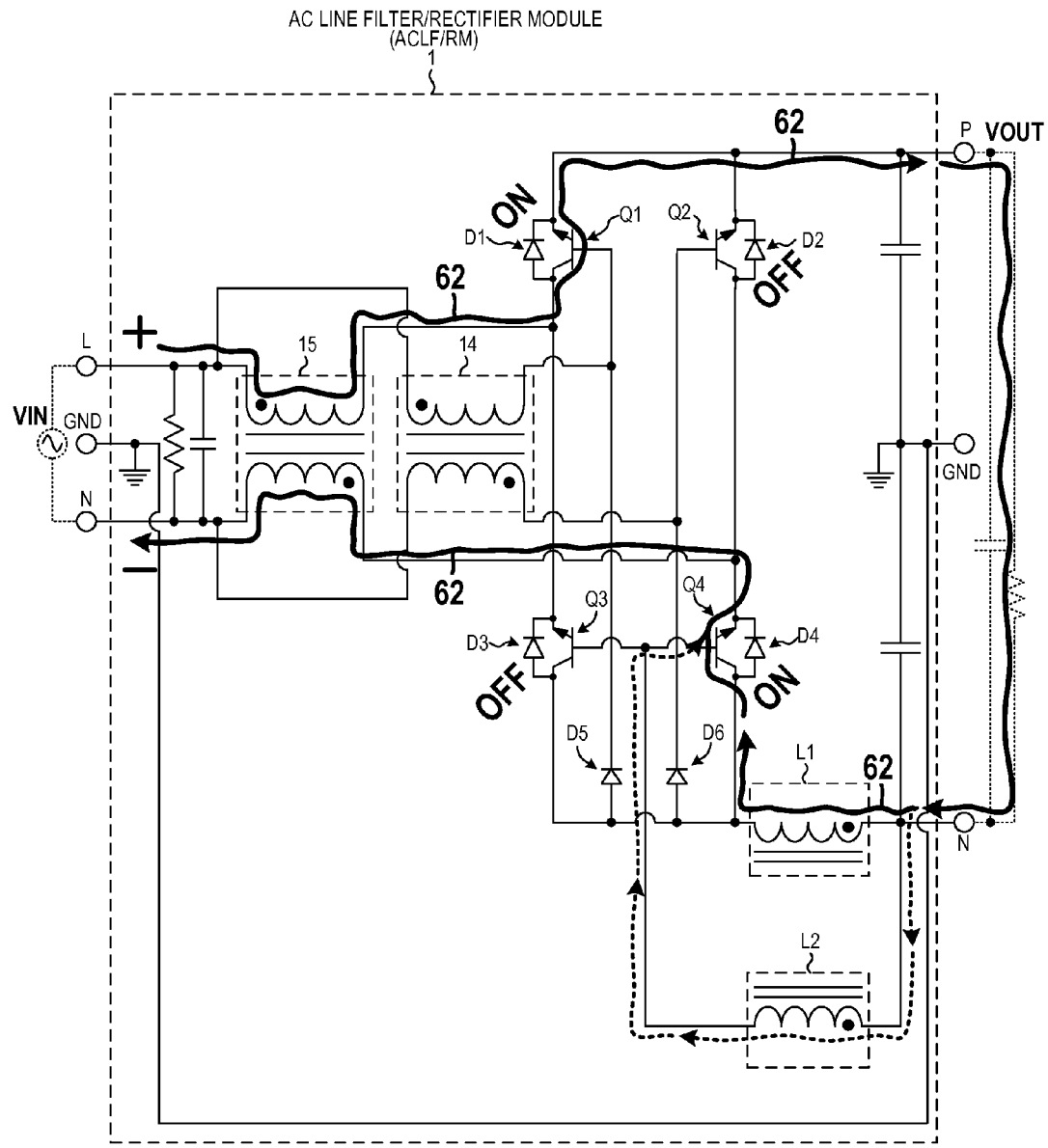
FIG. 8A is a diagram that illustrates major current flow through the ACLF/RM at time T1 in the waveform of FIG. 7.

At time T1, the voltage on the L AC input module terminal 7 is positive with respect to the voltage on the N AC input module terminal 9. The arrows in FIG. 8A illustrate the current path 62 of major current flow. Note that the current flowing from the N DC output module terminal 4 and into the ACLF/RM is split by inductors L1 and L2 so that some of the current flows to the collector of transistor Q4 and so that the rest of the current flows to the base of transistor Q4.

Figure 8B:
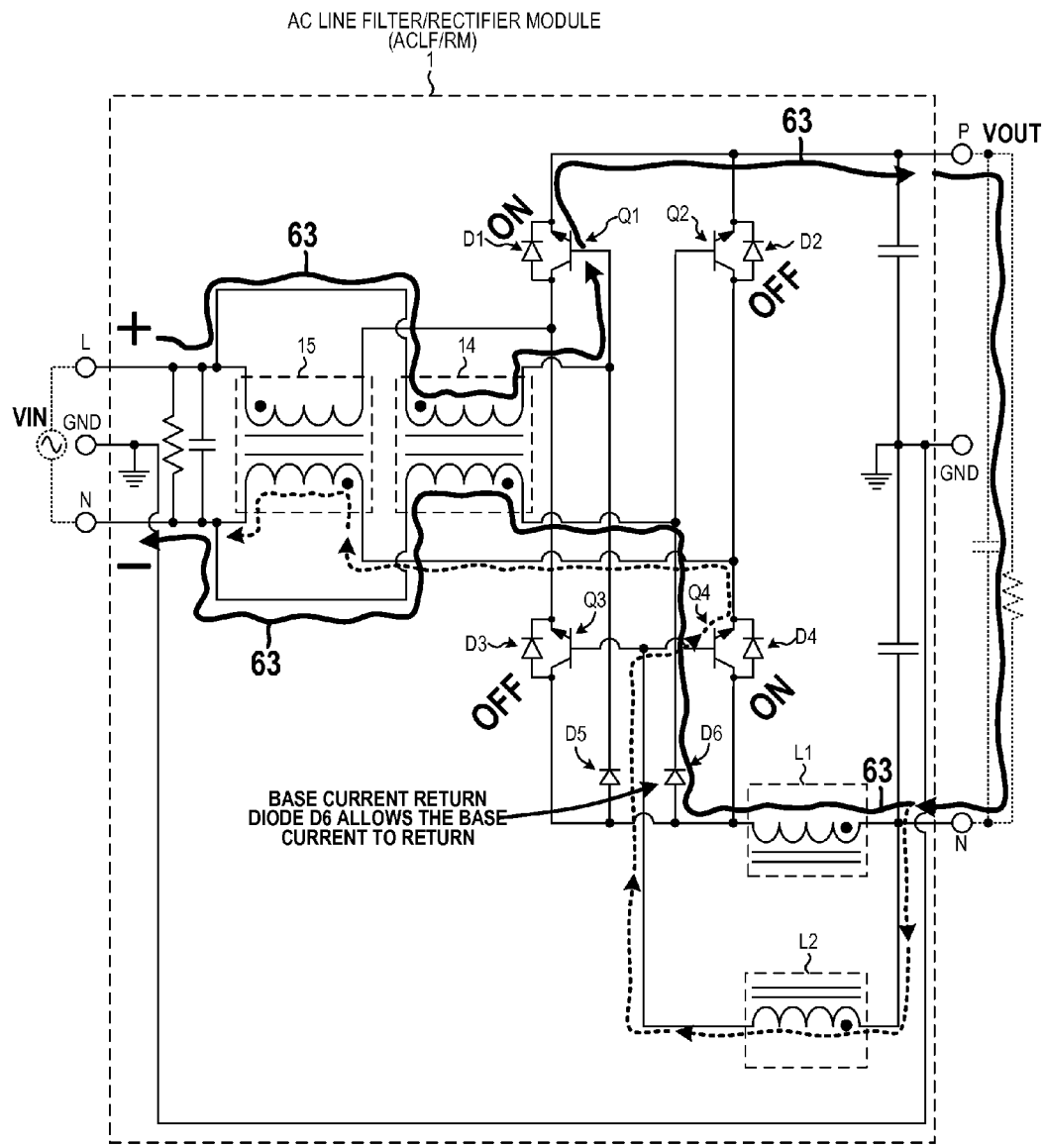
FIG. 8B is a diagram that illustrates minor (base) current flow through the ACLF/RM at time T1 in the waveform of FIG. 7.

The arrows in FIG. 8B illustrate the current path 63 of minor (base) current flow. At time T1, the low forward voltage rectifiers of Q1/D1 and Q4/D4 are on, whereas the low forward voltage rectifiers of Q2/D2 and Q3/D3 are off.

The coupling coefficient of two-winding inductor 14 is 1.0, and diode D6 allows a return current path for the base current of transistor Q1 back to the AC source as illustrated. Due to the current splitting inductors L1 and L2, some of the current flows through inductor L2, to the base of transistor Q4, out of the emitter of transistor Q4, and through the second winding 43 of two-winding inductor 15 to the N input module terminal 9.

Figure 9A:
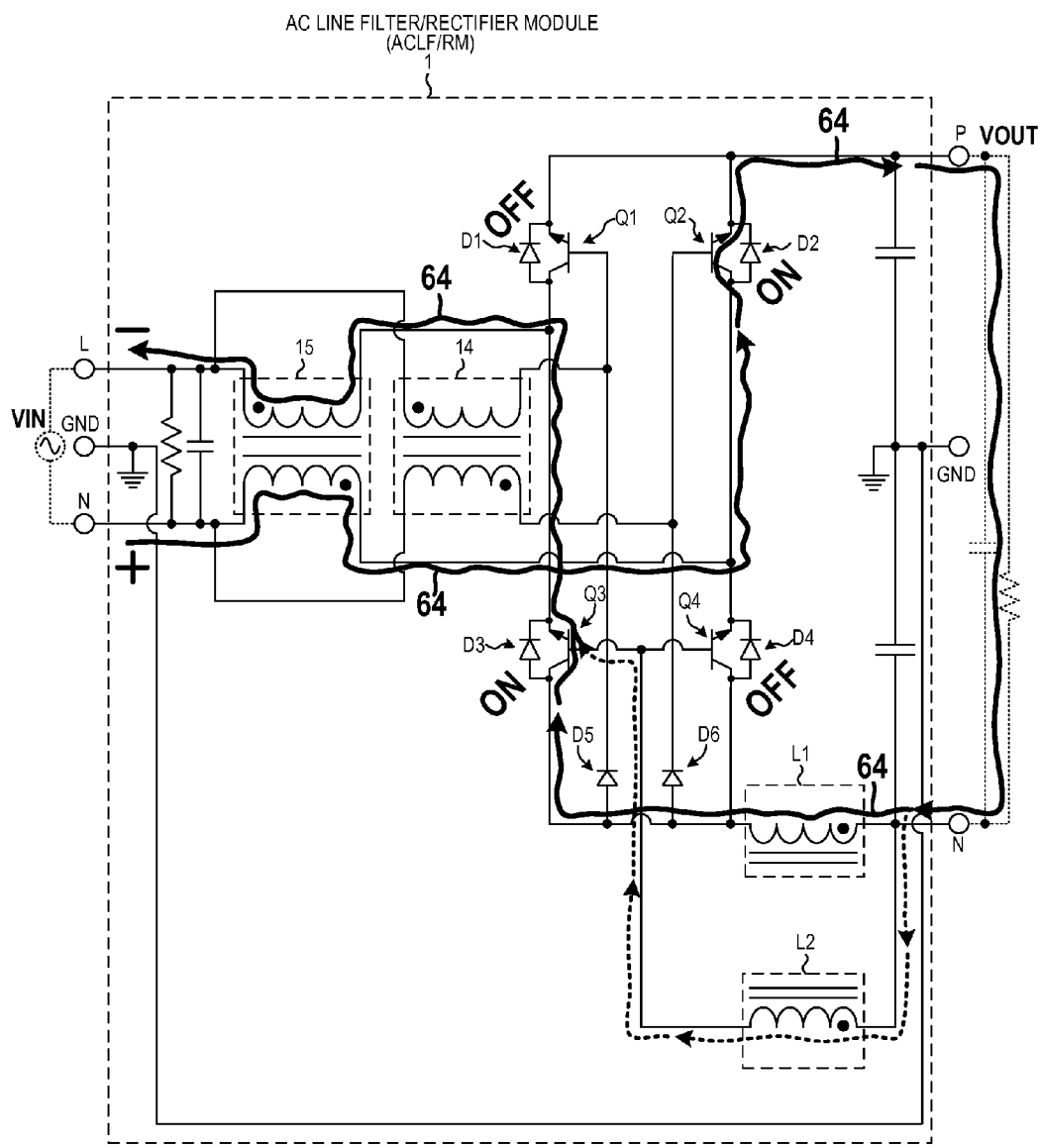
FIG. 9A is a diagram that illustrates major current flow through the ACLF/RM at time T2 in the waveform of FIG. 7.

At time T2, the voltage on the N AC input module terminal 9 is positive with respect to the voltage on the L AC input module terminal 7. The arrows in FIG. 9A illustrate the current path 64 of major current flow. Again, note that the current flowing from the N DC output module terminal 4 and into the ACLF/RM is split by inductors L1 and L2 so that some of the current flows to the collector of transistor Q3 and so that the rest of the current flows to the base of transistor Q3.

Figure 9B:
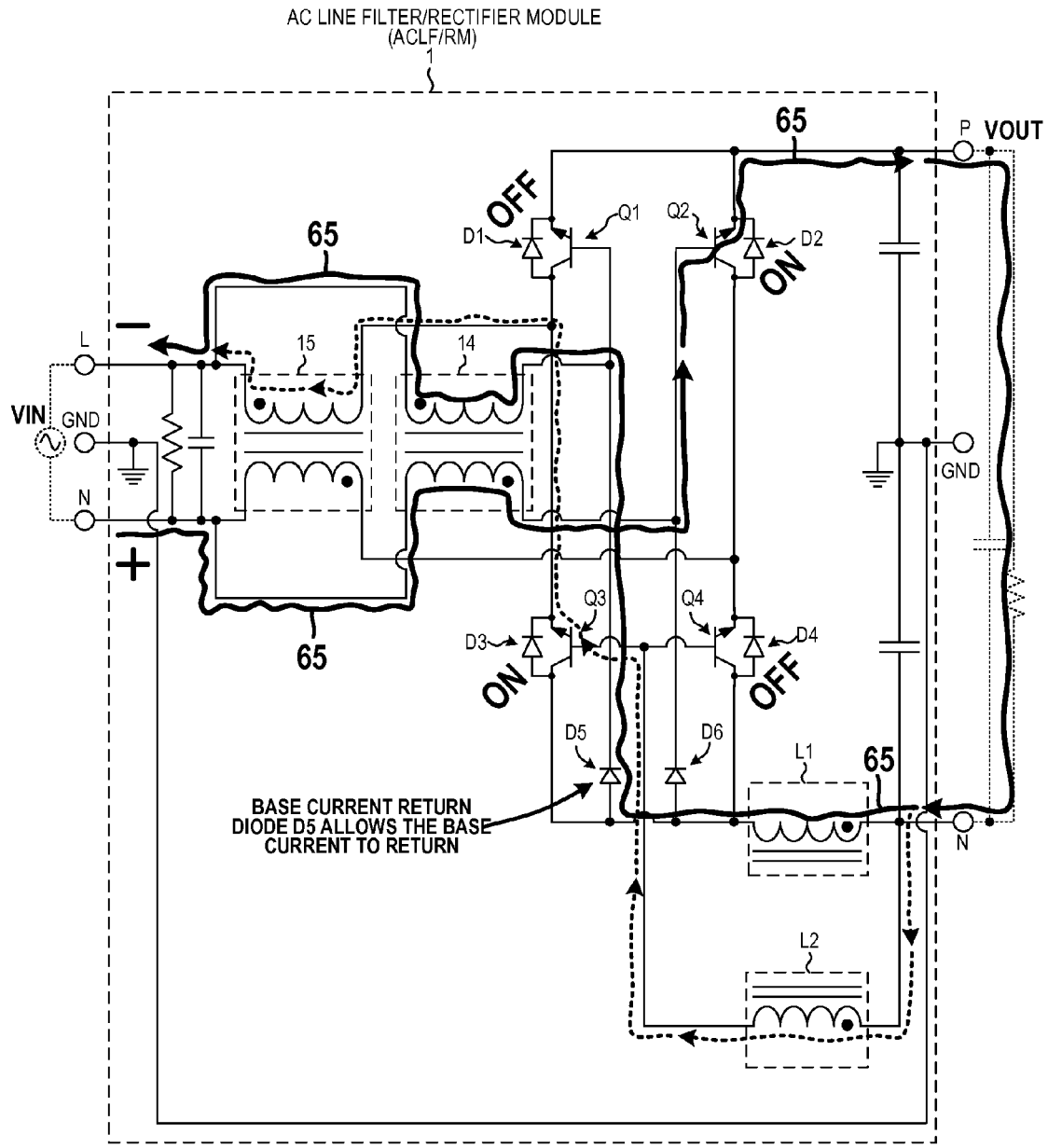
FIG. 9B is a diagram that illustrates minor (base) current flow through the ACLF/RM at time T2 in the waveforms of FIG. 7.

The arrows in FIG. 9B illustrate the current path 65 of minor (base) current flow. At time T2, the low forward voltage rectifiers of Q2/D2 and Q3/D3 are on, whereas the low forward voltage rectifiers of Q1/D1 and Q4/D4 are off.

The waveform diagram of FIG. 7 and the current flow diagrams of FIGS. 8A, 8B, 9A and 9B and the associated discussion of them above is somewhat simplified and is presented in simplified form for instructional purposes. Actual circuit operation is more complex. In actuality, the two-winding inductors 14 and 15 are not ideal or perfect current transformers. Accordingly, there may be a different amount of current flowing through the first winding of such a two-winding inductor than is flowing through the second winding. In addition, the current splitting inductors L1 and L2 are not ideal. The return current may be split in a different way at some times of circuit operation than at other times of circuit operation for various reasons and due to various effects. For a more detailed and accurate understanding of the operation of the circuit of FIG. 6 the circuit should be simulated using a circuit simulation program such as SPICE, and in addition the circuit should be breadboarded with real components and then operated and tested to determine real current flows and real voltages.

Figure 10:
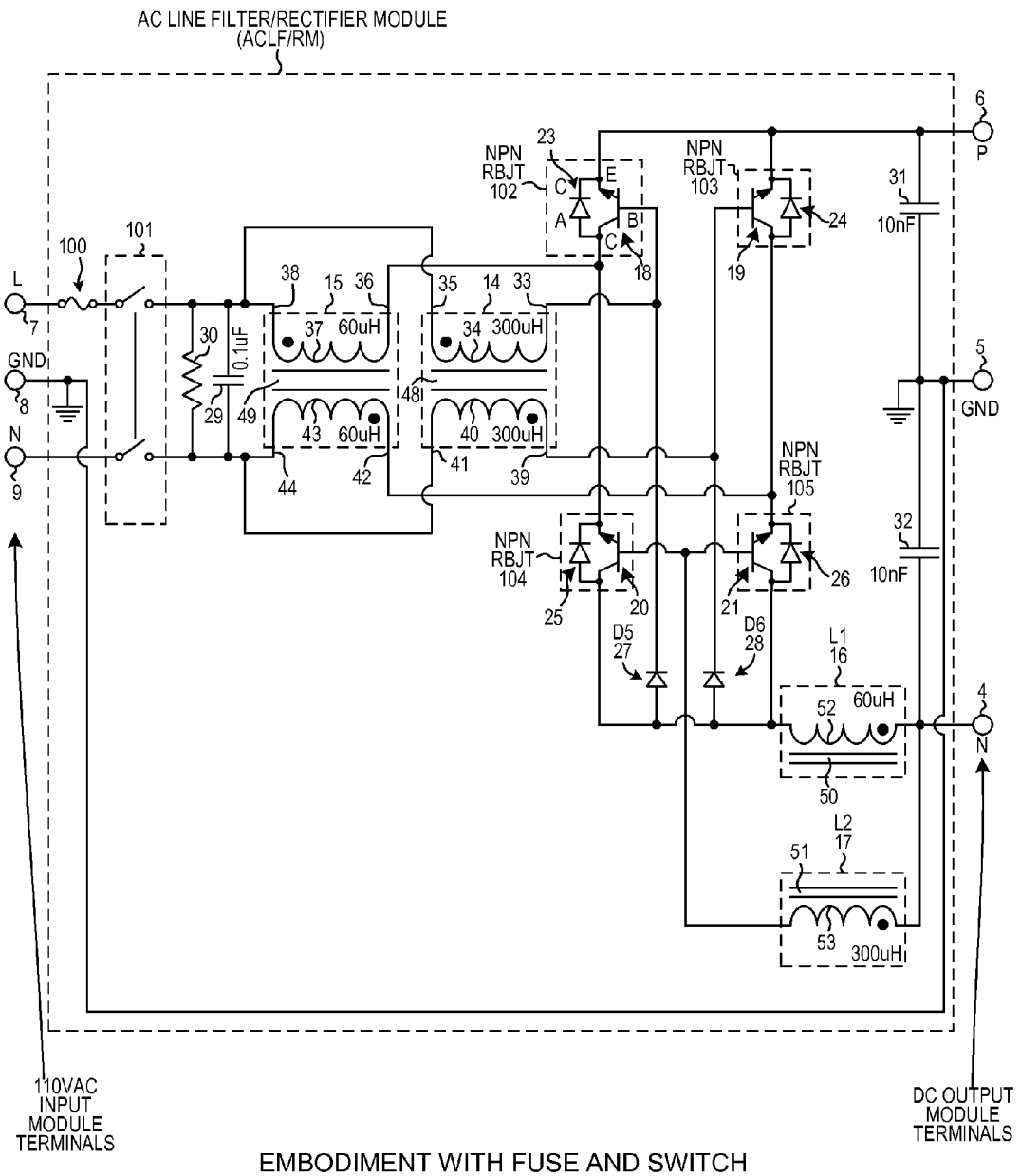
FIG. 10 is a circuit diagram of an ACLF/RM in accordance with another novel aspect.

FIG. 10 is a circuit diagram of another embodiment of an ACLF/RM that employs NPN bipolar transistors but advantageously has no low forward voltage rectifiers that include PNP bipolar transistors. The embodiment of FIG. 10 includes an additional fuse 100 and a finger-manipulatable, double-pole double-throw, ON/OFF mechanical switch 101. In addition, the diagram of FIG. 10 discloses that each NPN bipolar transistor and parallel-connected diode pair can be implemented as an NPN Reverse Bipolar Junction Transistor (RBJT) integrated circuit die. NPN bipolar transistor Q1 and diode D1 are parts of a first NPN RBJT die 102. NPN bipolar transistor Q2 and diode D2 are parts of a second NPN RBJT die 103. NPN bipolar transistor Q3 and diode D3 are parts of a third NPN RBJT die 104. NPN bipolar transistor Q4 and diode D4 are parts of a fourth NPN RBJT die 105. In each of these RBJT dice, the parallel-connected diode is implemented as a distributed diode so that if appreciable current flows through the diode the current will be substantially distributed and spread out so that it flows through a large cross-sectional area and volume of silicon and will not all flow through one small narrow current path. In one example, the NPN RBJTs are RBJT dice as described in one of the following two U.S. Patent documents: 1) U.S. Pat. No. 8,648,399, entitled "Bipolar Junction Transistor For Current Driven Synchronous Rectifier", filed Nov. 17, 2011, as U.S. patent application Ser. No. 13/299,340, by Kyoung Wook Seok, and 2) U.S. patent application Ser. No. 14/675,704, entitled "Reverse Bipolar Junction Transistor Integrated Circuit" filed Mar. 31, 2015, by Kyoung Wook Seok (the entire subject matter of each of these two patent documents is incorporated herein by reference). Each NPN RBJT die is packaged in its own three-lead semiconductor device package (for example, a TO-262 package). The leads of the package are soldered to the printed circuit board within the ACLF/RM along with other circuit components shown on the circuit diagram. The body tab of the TO-262 package can be thermally and mechanically fixed to the inside of the metal housing of the ACLF/RM to facilitate using the metal of the housing as a heatsink for the RBJT devices. The other circuit components shown in FIG. 10 are likewise soldered to the printed circuit board within the ACLF/RM.

Although an example of the novel ACLF/RM that involves no PNP bipolar transistors is set forth above in connection with a specific circuit where two two-winding inductors 14 and 15 are disposed between the AC input module terminals 7-9 and the four bipolar transistors 18-21, this is just one example of one circuit topology. In another example of the novel ACLF/RM that involves no PNP transistors, the four bipolar transistors that perform rectification are disposed between the AC input module terminals and the two two-winding inductors. For additional detail on an ACLF/RM circuit where the bipolar transistors are disposed in this way between the AC input module terminals and the two two-winding inductors, see FIG. 9 of U.S. patent application Ser. No. 14/611,193 (the entire contents of which is incorporated herein by reference). In general, the topology of FIG. 6 set forth in this patent document is considered superior, however, because placing the two two-winding inductors between the AC input module terminals and the bipolar transistors helps to block rectification noise generated by the switching transistors from passing back out to the AC input module terminals and into the cord and circuit that supplies AC power to the ACLF/RM. The two-winding inductors block some of this high frequency switching noise from passing from the transistor portion of the circuit where the noise is generated back to the AC input module terminals.

Although certain specific embodiments are described above for instructional purposes, the teachings of this patent document have general applicability and are not limited to the specific embodiments described above. In some examples, the ACLF/RM includes no AC inlet socket, but rather the ACLF/RM module has terminals that are designed to be soldered directly to a printed circuit board. In other examples, the AC input socket is another type of socket other than an IEC60320-1 C14 inlet socket. The socket can, for example, be an IEC60320-1 C13 inlet socket, an IEC60320-1 C15 inlet socket, an IEC60320-1 C16 inlet socket, an IEC60320-1 C20 inlet socket, or another suitable type of socket or connector. The ACLF/RM may, or may not, include a finger-manipulatable ON/OFF switch. The ACLF/RM may, or may not, include a fuse. Although examples of ACLF/RMs are set forth above where the housings include metal case portions and metal cover portions, in other examples of ACLF/RMs a part of the housing (such as a bottom face portion) is not made of metal. Additional techniques may be employed to provide better thermal contact between the TO-262 packages and the metal housing of the ACLF/RM. For example, the TO-262 packages may be connected to a piece of a multi-piece housing in the same way that a TO-262 package would ordinarily be connected to a heatsink, except that the TO-262 packages are disposed within the housing and are fixed to the inside surface of the housing. Although an implementation of the circuit as a module is set forth, the circuit in other examples is not part of an AC line filter module. For example, the AC line filter and rectifier circuitry may be realized outside of any housing such that the individual components of the circuit are mounted onto a printed circuit along with other circuitry, or may be realized on the printed circuit board with a metal shield or covering metal cap. Some of the individual components may not be directly mounted to the printed circuit board, but rather may be physically connected to other components so that they in effect are suspected within the module housing by their leads. Such suspended components may be held in place by an amount of encapsulant that is made to bond the suspended components to one another and to other components within the housing. Accordingly, various modifications, adaptations, and combinations of various features of the described embodiments can be practiced without departing from the scope of the invention as set forth in the claims.

What is claimed is:

1. An Alternating Current Line Filter/Rectifier Module (ACLF/RM) comprising:
    a first Direct Current (DC) output module terminal;
    a second DC output module terminal;
    a first NPN bipolar transistor having a base, collector, and emitter;
    a first diode having a cathode coupled to the emitter of the first NPN bipolar transistor and having an anode coupled to the collector of the first NPN bipolar transistor;
    a second NPN bipolar transistor having a base, collector and emitter, wherein the emitter of the second NPN bipolar transistor is coupled to the emitter of the first NPN bipolar transistor;
    a second diode having a cathode coupled to the emitter of the second NPN bipolar transistor and having an anode coupled to the collector of the second NPN bipolar transistor;
    a third NPN bipolar transistor having a base, collector, and emitter, wherein the emitter of the third NPN bipolar transistor is coupled to the collector of the first NPN bipolar transistor;
    a third diode having a cathode coupled to the emitter of the third NPN bipolar transistor and having an anode coupled to the collector of the third NPN bipolar transistor;
    a fourth NPN bipolar transistor having a base, collector, and emitter, wherein the collector of the fourth NPN bipolar transistor is coupled to the collector of the third NPN bipolar transistor, wherein the emitter of the fourth NPN bipolar transistor is coupled to the collector of the second NPN bipolar transistor;
    a fourth diode having a cathode coupled to the emitter of the fourth NPN bipolar transistor and having an anode coupled to the collector of the fourth NPN bipolar transistor;
    a first Alternating Current (AC) input module terminal;
    a second AC input module terminal, wherein the first and second AC input module terminals are adapted to receive an AC input voltage signal onto the ACLF/RM such that a rectified version of the AC input voltage signal is output by the ACLF/RM across the first and second DC output module terminals.

2. The ACLF/RM of claim 1, wherein the second DC output module terminal is a ground terminal, wherein in a part of a first half cycle of a cycle of the AC input voltage signal a first current flows in a first current path from the first AC input module terminal to the collector of the first NPN bipolar transistor, through the first NPN bipolar transistor to the emitter of the first NPN bipolar transistor, out of the first DC output module terminal, into the second DC output module terminal to the collector of the fourth NPN bipolar transistor, through the fourth NPN bipolar transistor to the emitter of the fourth NPN bipolar transistor, and out of the second AC input module terminal, wherein in a part of a second half cycle of the cycle of the AC input voltage signal a second current flows in a second current path from the second AC input module terminal to the collector of the second NPN bipolar transistor, through the second NPN bipolar transistor to the emitter of the second NPN bipolar transistor, out of the first DC output module terminal, into the second DC output module terminal to the collector of the third NPN bipolar transistor, through the third NPN bipolar transistor to the emitter of the third NPN bipolar transistor, and out of the first AC input module terminal.

3. The ACLF/RM of claim 1, further comprising:
    a metal housing that houses the first through fourth NPN bipolar transistors and that also houses the first through fourth diodes, wherein the first and second AC input module terminals are secured with respect to the metal housing, and wherein the first and second DC output module terminals are secured with respect to the metal housing.

4. The ACLF/RM of claim 1, further comprising:
    an AC power socket, wherein the first and second AC input module terminals are parts of the AC power socket, and wherein the AC power socket is taken from the group consisting of: an IEC60320-1 C13 inlet socket, an IEC60320-1 C14 inlet socket, an IEC60320-1 C15 inlet socket, an IEC60320-1 C16 inlet socket, and an IEC60320-1 C20 inlet socket.

5. The ACLF/RM of claim 1, further comprising:
    a fifth diode having an anode coupled to the collectors of the third and fourth NPN bipolar transistors, and having a cathode coupled to the base of the first NPN bipolar transistor; and
    a sixth diode having an anode coupled to the collectors of the third and fourth NPN bipolar transistors, and having a cathode coupled to the base of the second NPN bipolar transistor.

6. The ACLF/RM of claim 1, further comprising:
    a first one-winding inductor that has a winding that is wound on a first core, wherein the winding has a first terminal and a second terminal, wherein the second terminal of the first one-winding inductor is coupled to the collectors of the third and fourth NPN bipolar transistors; and
    a second one-winding inductor that has a winding that is wound on a second core, wherein the winding has a first terminal and a second terminal, wherein the second terminal of the second one-winding inductor is coupled to the bases of the third and fourth NPN bipolar transistors, and wherein the first terminal of the second one-winding inductor is coupled to the first terminal of the first one-winding inductor.

7. The ACLF/RM of claim 1, further comprising:
    a first two-winding inductor comprising:
        a first core;
        a first winding wound on the first core, wherein the first winding has a first terminal and a second terminal, wherein the first terminal of the first winding is coupled to the base of the first NPN bipolar transistor; and a second winding wound on the first core, wherein the second winding has a first terminal and a second terminal, wherein the first terminal of the second winding is coupled to the base of the second NPN bipolar transistor; and a second two-winding inductor comprising:
a second core;
a first winding wound on the second core, wherein the first winding has a first terminal and a second terminal, wherein the first terminal of the first winding is coupled to the collector of the first NPN bipolar transistor, and wherein second terminal of the first winding of the second two-winding inductor is coupled to the second terminal of the first winding of the first two-winding inductor; and
a second winding wound on the second core, wherein the second winding has a first terminal and a second terminal, wherein the first terminal of the second winding is coupled to the collector of the second NPN bipolar transistor, and wherein second terminal of the second winding of the second two-winding inductor is coupled to the second terminal of the second winding of the first two-winding inductor.

8. The ACLF/RM of claim 7, wherein the second terminals of the first windings of the first and second two-winding inductors are coupled to the first AC input module terminal, and wherein the second terminals of the second windings of the first and second two-winding inductors are coupled to the second AC input module terminal.

9. The ACLF/RM of claim 7, wherein the second terminals of the first windings of the first and second two-winding inductors are coupled to the first AC input module terminal at least in part via a mechanical switch.

10. The ACLF/RM of claim 1, further comprising:
a current splitting inductor circuit, wherein the current splitting inductor circuit receives a current onto a first node, and supplies a first part of the current onto a second node, and supplies a second part of the current onto a third node.

11. The ACLF/RM of claim 10, wherein the current splitting inductor circuit comprises:
a first inductor that is wound on a first core; and
a second inductor that is wound on a second core.

12. The ACLF/RM of claim 11, wherein the collectors of two of the first through fourth NPN bipolar transistors are coupled to the third node, and wherein the bases of two of the first through fourth NPN bipolar transistors are coupled to the second node.

13. The ACLF/RM of claim 12, wherein the first NPN bipolar transistor and the first diode are parts of a first semiconductor device, wherein the second NPN bipolar transistor and the second diode are parts of a second semiconductor device, wherein the third NPN bipolar transistor and the third diode are parts of a third semiconductor device, and wherein the fourth NPN bipolar transistor and the fourth diode are parts of a fourth semiconductor device.

14. An apparatus comprising:
four low forward voltage rectifier circuits, wherein each of the low forward voltage rectifier circuits comprises an NPN bipolar transistor and a diode, wherein an anode of the diode is coupled to a collector of the NPN bipolar transistor, and wherein a cathode of the diode is coupled to an emitter of the NPN bipolar transistor;
a pair of Direct Current (DC) output terminals; and
a pair of Alternating Current (AC) input terminals adapted to receive an AC input voltage signal onto the apparatus such that a rectified version of the AC input voltage signal is output from the apparatus via the pair of DC output terminals, and wherein in a part of a first half cycle of a cycle of the AC input voltage signal a current flows through a first pair of the four low forward voltage rectifier circuits and such that in a part of a second half cycle of the cycle of the AC input voltage signal a current flows through a second pair of the four low forward voltage rectifier circuits.

15. The apparatus of claim 14, further comprising:
a housing that houses the four low forward voltage rectifier circuits, wherein the pair of DC output terminals are accessible from outside the housing, and wherein the pair of AC input terminals are accessible from outside the housing.

16. The apparatus of claim 15, wherein the housing does not house any power transistor other than four power NPN bipolar transistors of the four low forward voltage rectifier circuits.

17. The apparatus of claim 14, further comprising:
a two-winding inductor comprising a first winding and a second winding, wherein the first and second windings are wound around a common core, wherein the first winding is coupled to a base of a first NPN bipolar transistor of a first of the four low forward voltage rectifiers, and wherein the second winding is coupled to a base of a second NPN bipolar transistor of a second of the four low forward voltage rectifiers.

18. The apparatus of claim 14, further comprising:
a current splitting inductor circuit, wherein the current splitting inductor circuit receives a current onto a first node, and supplies a first part of the current onto a second node, and supplies a second part of the current onto a third node.

19. The apparatus of claim 18, wherein the collectors of two of the NPN bipolar transistors of the four low forward voltage rectifier circuits are coupled to the third node, wherein the bases of two of the NPN bipolar transistors of the four low forward voltage rectifier circuits are coupled to the second node, and wherein one of the DC output terminals is coupled to the first node.

20. A method of manufacturing an apparatus, the method comprising:
providing four low forward voltage rectifier circuits in a housing, wherein each of the low forward voltage rectifier circuits comprises an NPN bipolar transistor and a diode, wherein an anode of the diode is coupled to a collector of the NPN bipolar transistor, and wherein a cathode of the diode is coupled to an emitter of the NPN bipolar transistor;
providing a pair of Direct Current (DC) output terminals so that they are fixed with respect to the housing and so that they are accessible from outside the housing; and
providing a pair of Alternating Current (AC) input terminals so that they are fixed with respect to the housing and so that they are accessible from outside the housing, wherein the four low forward voltage rectifier circuits, the pair of DC output terminals and the pair of AC input terminals are provided such that: 1) a current can flow during a part of a first half cycle of a cycle of an AC input voltage signal through a first pair of the four low forward voltage rectifier circuits so that a rectified version of the AC input voltage signal will be present across the DC output terminals, and 2) a current can flow during a part of a second half cycle of the cycle of the AC input voltage signal through a second pair of the four low forward voltage rectifier circuits so that the rectified version of the AC input voltage signal will be present across the DC output terminals.

21. The method of manufacture of claim 20, further comprising:
provide a current splitting inductor circuit in the housing, wherein the current splitting inductor circuit is provided so that it can receive a current from a first node, and output a portion of the received current onto a second node, and output the remainder of the received current onto a third node, wherein the second node is coupled to bases of two NPN bipolar transistors, and wherein the third node is coupled to collectors of the two NPN bipolar transistors.

22. The method of manufacture of claim 21, wherein the apparatus is an AC line filter and rectifier module, and wherein the housing houses no power transistor other than four power NPN bipolar transistors.

* * * * *